(12) United States Patent
Katsura et al.

(10) Patent No.: US 6,683,925 B1
(45) Date of Patent: Jan. 27, 2004

(54) WIRELESS TERMINAL DEVICE

(75) Inventors: Takatoshi Katsura, Hyogo (JP); Kenji Itoh, Hyogo (JP); Shinjirou Fukuyama, Hyogo (JP); Mitsuru Mochizuki, Hyogo (JP); Hiroaki Nagano, Hyogo (JP); Yoshinori Matsunami, Hyogo (JP); Fumio Ishizu, Hyogo (JP); Ryoji Hayashi, Hyogo (JP)

(73) Assignee: Mitsubishi Denki Kabushiki Kaisha (JP)

( * ) Notice: Subject to any disclaimer, the term of this patent is extended or adjusted under 35 U.S.C. 154(b) by 405 days.

(21) Appl. No.: 09/694,678

(22) Filed: Oct. 24, 2000

Related U.S. Application Data

(62) Division of application No. PCT/JP99/00851, filed on Feb. 24, 1999.

(51) Int. Cl.[7] .............................................. H04L 27/08
(52) U.S. Cl. ................ 375/345; 455/234.1; 455/245.1; 375/316
(58) Field of Search ................... 375/285, 316, 375/340, 345, 346, 317, 318, 319; 455/232.1, 234.1, 245.1, 247.1, 249.1, 250.1, 324, 341, 343; 330/254, 129

(56) References Cited

U.S. PATENT DOCUMENTS 5,204,976 A * 4/1993 Baldwin et al. ......... 455/234.2
5,748,681 A * 5/1998 Comino et al. ............. 375/319
5,787,126 A 7/1998 Itoh et al. .................... 375/340
6,163,685 A * 12/2000 Dilling et al. ........... 455/247.1
6,212,244 B1 * 4/2001 Davidovici et al. ......... 375/345

FOREIGN PATENT DOCUMENTS

| JP | 61-169030 | 7/1986 |
| JP | 63-67024 | 3/1988 |
| JP | 4-189035 | 7/1992 |
| JP | 6-260861 | 9/1994 |
| JP | 10-51252 | 2/1998 |
| JP | 10-56343 | 2/1998 |

* cited by examiner

Primary Examiner—Chieh M. Fan
(74) Attorney, Agent, or Firm—Rothwell, Figg, Ernst & Manbeck

(57) ABSTRACT

A level of a base band signal at an input side of a variable gain amplification circuit is detected by a logarithmic amplifier having a wide input voltage range at a start of an operation, a control unit then performs a coarse feedforward control on a gain of the variable gain amplifier based on the detected level and finds a level of an output of an A/D converter by a mean square deriving circuit and inputs the resulting signal to the control unit. Then the control unit performs a fine feedback control on the variable gain amplifier based on the detected level.

3 Claims, 16 Drawing Sheets

PERIOD FOR
MEASURING
LEVEL OF
ANOTHER
BASE STATION

WIRELESS TERMINAL DEVICE

REFERENCE TO RELATED APPLICATION

This Application is a continuation of International Application No. PCT/JP99/00851, whose international filing date is Feb. 24, 1999, the disclosure of which is incorporated by reference herein.

BACKGROUND OF THE INVENTION

1. Field of the Invention

The present invention relates to wireless terminal devices and, more particularly to a wireless terminal device, such as a portable telephone, having a receiving unit with a direct conversion system in which a received signal is converted directly into a base band signal.

2. Description of the Background Art

In a heterodyne conversion system for receivers, which has been well known, a received signal is converted into an intermediate frequency (IF) signal by a mixer (MIX) and then an unwanted wave is removed by a band-pass filter (BPF) for the IF. After that, complex envelope detection is performed by a quadrature mixer (QMIX) to supply a base band signal. In the heterodyne conversion system, however, as the intermediate frequency exists an intermediate frequency circuit, such as a band-pass filter, must be provided, resulting in the increase in the number of components and space for mounting the components.

On the other hand, in a direct conversion system, a received signal is directly converted into a base band signal by a quadrature mixer. FIG. 1 is a block diagram referenced for describing the direct conversion system.

FIG. 1 shows an example in which the direct conversion system is employed for a portable telephone which operates according to a certain communication system, such as CDMA system, in which transmission and reception are performed simultaneously and, a transmission system connected to a duplexer (DUP) 2 is not shown. In FIG. 1, a high-frequency signal received by an antenna 1 is supplied to a low-noise amplifier (AMP) 3 via duplexer 2, a received signal of a low level is amplified, an unwanted high-frequency band component such as an external interference wave is removed by a band-pass filter (BPF) 4 and the remaining component is converted into a base band signal by a quadrature mixer (QMIX) 5.

Here, the relation between a frequency $f_{rx}$ of the received signal, which is an output from band-pass filter 4 and a local oscillation frequency $f_{lo}$ of quadrature mixer 5 is represented by the following expression:

$$f_{bb} = f_{rx} - f_{lo},$$

where $f_{bb}$ is the base band signal. As the frequency of the base band signal is sufficiently lower than that of the received signal, $f_{rx} = f_{lo}$ holds.

The base band signal obtained through conversion is amplified by a low-noise amplifier (AMP) 6 and the resulting signal is supplied to a low-pass filter (LPF) 7 where an interference wave such as an adjacent channel component is removed from the base band signal.

Further, the base band signal is supplied to a variable gain amplifier (VGA) 8 and amplified to maintain an input to an A/D converter 9 in the next stage at a constant level and, the resulting signal is converted into a digital signal by AID converter 9 and, demodulated at a demodulation circuit (DEM) 10. To achieve this operation, the level of the signal supplied to A/D converter 9 must not become saturated at A/D converter 9 or exceed a level of resolution.

In the receiver of the direct conversion system shown in FIG. 1, the elimination of the mixer and the band-pass filter for the intermediate frequency required in the heterodyne conversion system is allowed to achieve a simple circuit structure. In addition, a spurious response of the receiver to a signal represented by an image signal can be mitigated whereby the high-frequency band-pass filter can be replaced with a smaller band-pass filter 4.

In the portable telephone, however, the level of the base band signal supplied to A/D converter 9 at the onset of the operation, such as at power-on, is not predictable. To deal with this problem, the gain of variable gain amplifier 8 can be set to a suitable value based on an assumption.

When the initial set value of the gain of variable gain amplifier 8 is high, however, if a signal of a higher level than an input voltage range of A/D converter 9 as shown in FIG. 2A is supplied and is amplified with a high amplification factor by variable gain amplifier 8 and input to A/D converter 9, A/D converter 9 is saturated and the detection of the signal becomes impossible. In this case, a suitable level of the gain of variable gain amplifier 8 to be set for the next step cannot be known.

Conversely, when the initial set value of the gain of variable gain amplifier 8 is low, if a signal of a lower level than the resolution of A/D converter 9 as shown in FIG. 2B is supplied, the signal is hardly amplified by variable gain amplifier 8 and, the signal detection is not possible with the resolution of A/D converter 9. Hence, a suitable level of the gain of variable gain amplifier 8 to be set for the next step cannot be known.

Therefore, it is necessary to predict the suitable gain of variable gain amplifier 8, and to change the setting of the value a few times until the suitable value is set. Thus, the setting of the gain of variable gain amplifier 8 to an optimum level takes time.

To solve the above-described problem, the input voltage range of A/D converter 9 may be widened and A/D converter 9 with fine resolution may be employed. Such A/D converters, however, consume large current and are large in circuit size and their use in portable telephones is subjected to a certain limitation.

Thus, a main object of the present invention is to provide a wireless terminal device allowing a swift and secure gain control of the variable gain amplifier at the start of the operation.

SUMMARY OF THE INVENTION

The present invention is a wireless terminal device wherein a received signal is supplied to a variable gain circuit having a variable gain, a level of the received signal supplied to the variable gain circuit is detected by a first level detection circuit and, an input voltage range of the first level detection circuit is selected wide. An output signal of the variable gain circuit is converted into a digital signal by a conversion circuit, a level of an input signal or an output signal of the conversion circuit is detected by a second level detection circuit and, at the start of an operation, a control circuit coarsely controls the gain of the variable gain circuit based on a detection output from the first level detection circuit and thereafter finely controls the gain of the variable gain circuit based on a detection output from the second level detection circuit, thus the control is performed such that a signal supplied to the conversion circuit is in an input voltage range of the conversion circuit and detectable.

According to another aspect of the invention, the first level detection circuit is a logarithmic amplifier. The control circuit supplies power to the logarithmic amplifier at the start of the operation, performs a feedforward control such that the gain of the variable gain circuit is controlled based on a detection level of the logarithmic amplifier and then performs a feedback control such that the gain of the variable gain circuit is controlled based on the detection output of the second detection circuit. Thereafter, the control circuit stops power supply to the logarithmic amplifier.

According to still another aspect of the invention, a mobile terminal device is provided performing a level detection at predetermined intervals such that when the wireless terminal device moves to an adjacent wireless area, a reception level of a signal from the adjacent wireless area can be detected. The control circuit supplies power to the logarithmic amplifier shortly before the predetermined interval is elapsed.

According to a further aspect of the invention, an amplification circuit is provided in a previous stage to the variable gain circuit. The control circuit sets a gain of the amplification circuit and an input voltage range of the first level detection circuit based on a level detected by the first level detection circuit when the gain of the amplification circuit is set to a maximum value or a minimum value at the start of the operation and a level detected by a first level detection circuit when the gain of the amplification circuit is set to a minimum value or a maximum value.

According to a still further aspect, a quadrature frequency conversion circuit is provided in a previous stage to the variable gain circuit. The high-frequency input signal is converted into two signals with the same level and different phases, and the variable gain circuit and the conversion circuit are provided corresponding to two signals with different phases, respectively. The first level detection circuit detects and supplies a level of one of two signals with different phases to the control circuit. The second level detection circuit detects root-mean square values of respective detection signals of two variable gain circuits and supplies the values to the control circuit.

According to a still further aspect of the invention, a wireless terminal device directly converting the high-frequency signal into the base band signal is provided. The base band signal is supplied to a variable gain circuit having a variable gain. A level of the base band signal supplied to the variable gain circuit is detected by the level detection circuit. The input voltage range of the level detection circuit is selected wide. The output signal of the variable gain circuit is converted into a digital signal. The control circuit controls the gain of the variable gain circuit based on the detection output of the level detection circuit at the start of the operation and thus the adjustment is performed such that the signal supplied to the conversion circuit is within the input voltage range of the conversion circuit and detectable with the resolution thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
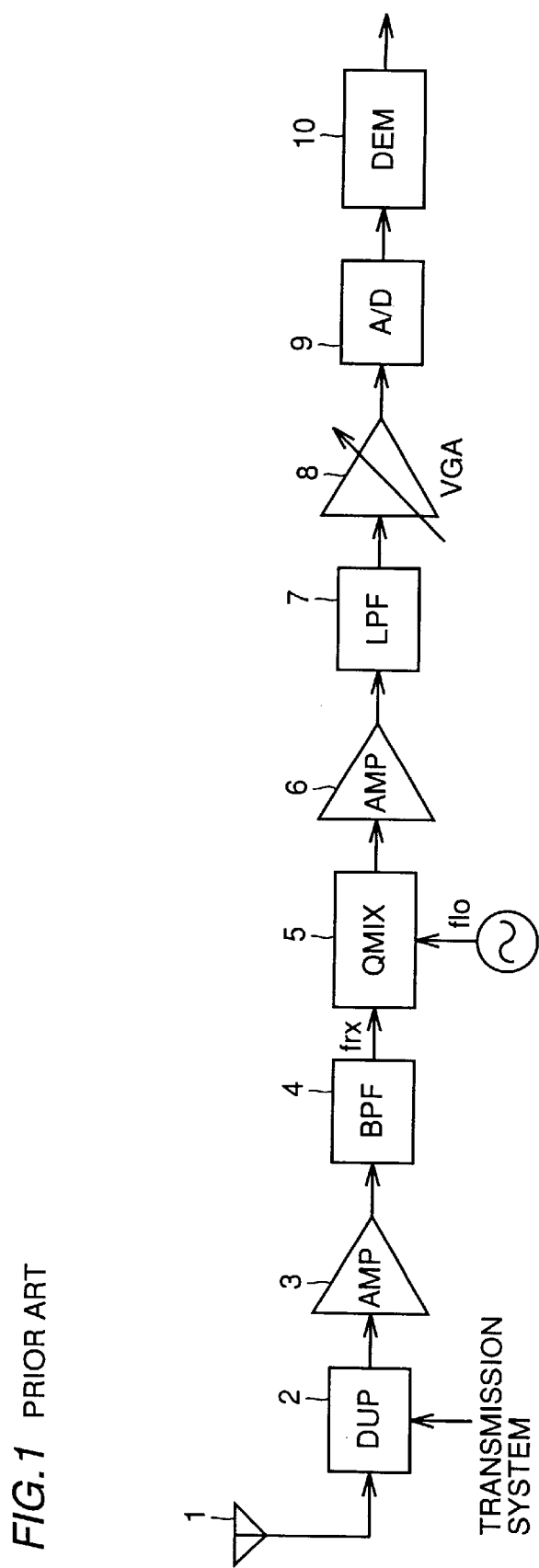
FIG. 1 is a block diagram of a reception system of a portable telephone adapting a conventional direct conversion system.
Figure 2A:
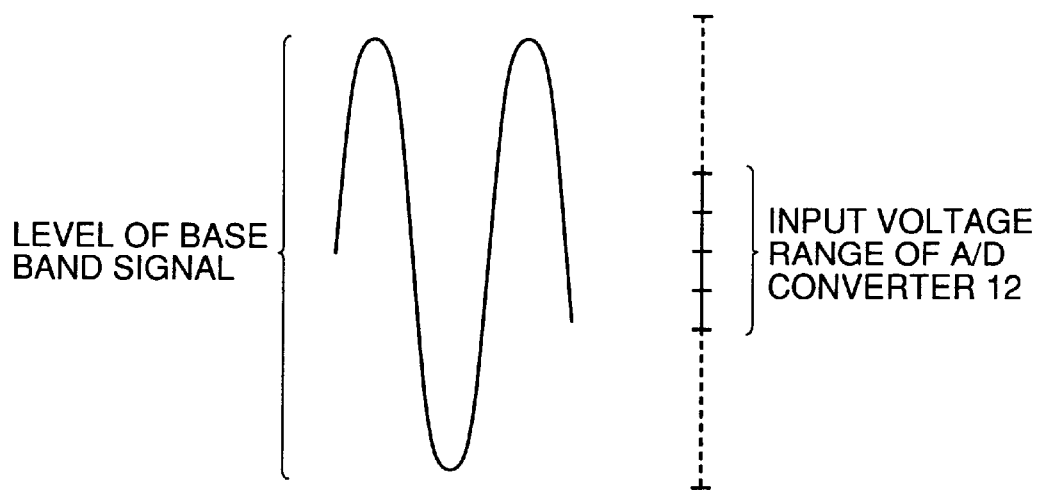
FIGS. 2A and 2B are diagrams referenced for describing problems in an example of a conventional art shown in FIG. 1.
Figure 2B:
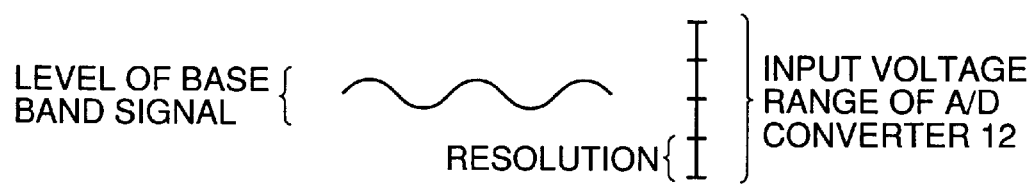
Figure 3:
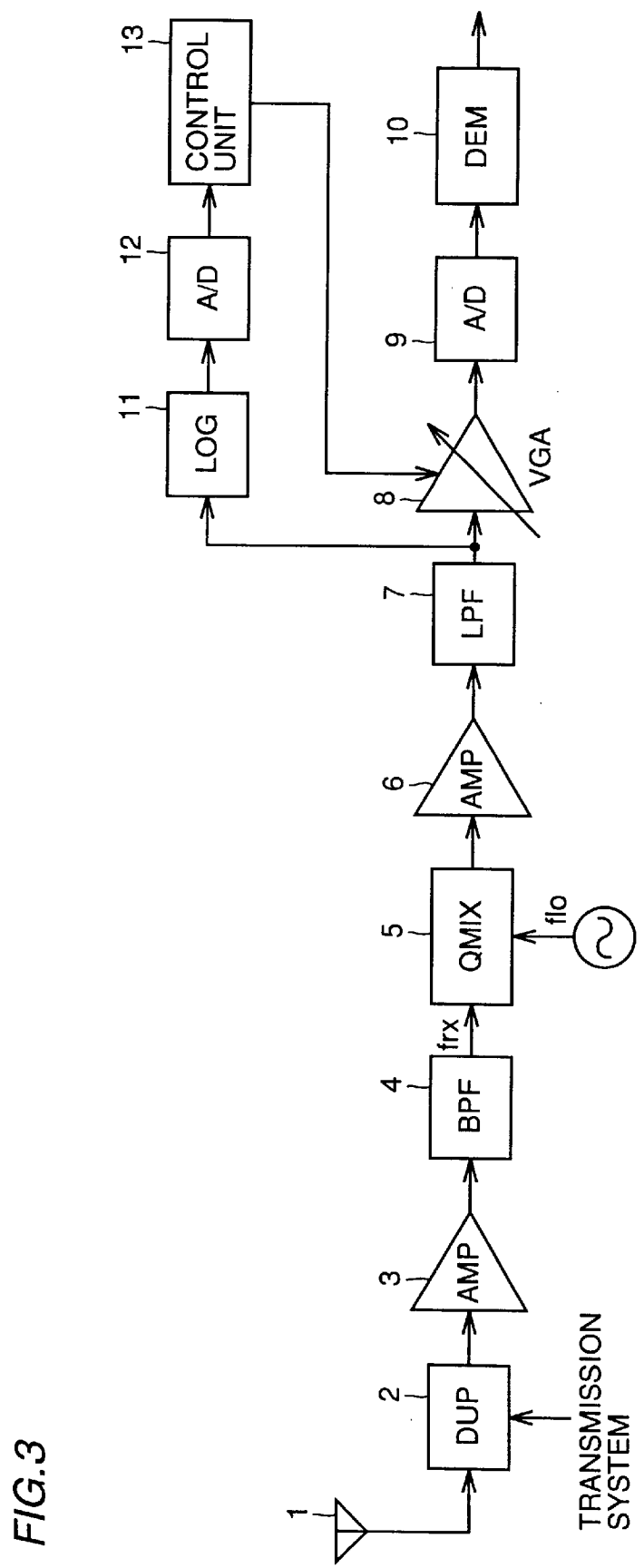
FIG. 3 is a block diagram of the first embodiment of the present invention.

FIG. 3 is a block diagram of the first embodiment of the present invention. In FIG. 3, the structure from an antenna 1 up to a demodulator 10 is same with that of FIG. 1. In this embodiment, a logarithmic amplifier 11, an A/D converter 12 and a control unit 13 are added. Logarithmic amplifier 11 detects a level of a base band signal supplied to variable gain amplifier 8. Here, logarithmic amplifier 11 does not detect the level of the input signal with a high accuracy but has a wide input voltage range even though with somewhat coarse accuracy. Here, the wide input voltage range is required to allow detection of input signals from a low level to a high level.

Here, the necessary detection range is a range in which a minimum bit number of A/D converter 9 required for the demodulation can be derived. (The required minimum bit number of A/D converter 9 is derived through test, simulation or the like and the kind of means utilized is not of importance here. The numerical value thereof is also different from case to case depending on demodulation characteristics of the receiver and the type of communication system. The numerical value, however, must be at least the resolution of A/D converter 9 and at most the input voltage range of A/D converter 9. In some system, the saturation at A/D converter 9 does not inhibit the demodulation.) An allowable tolerance for A/D converter 9 is determined based on a margin represented in bit of the required minimum bit number of A/D converter 9. Here, if the minimum bit number of A/D converter 9 required for a receiver is six and the input voltage range thereof is from −1V~1V and, the bit number of A/D converter 9 is eight and the input voltage range thereof is −2V to +2V, the allowable tolerance for logarithmic amplifier 11 is ideally +/−6 dB.

The detection signal of logarithmic amplifier 11 is converted into a digital signal by A/D converter 12 and the resulting signal is supplied to control unit 13. Control unit 13 performs feedforward control of a gain of variable gain amplifier 8 based on the digital signal obtained from the conversion of detection signal.

Figure 4:
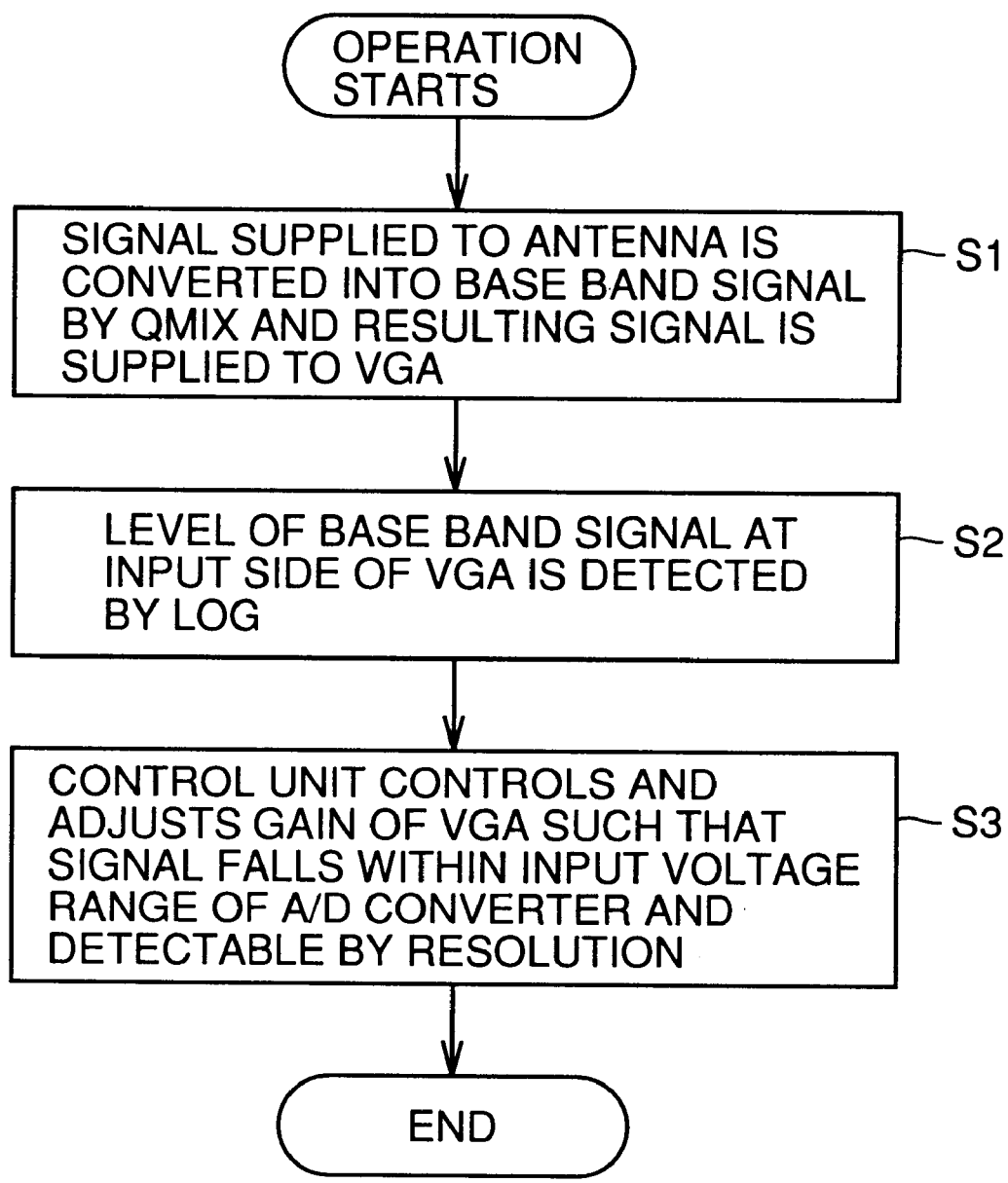
FIG. 4 is a flow chart referenced for describing an operation of the embodiment shown in FIG. 3.

FIG. 4 is a flow chart referenced for describing an operation of the embodiment shown in FIG. 3. Next, with reference to FIG. 4, the operation of the embodiment shown in FIG. 3 will be described. At the onset of the operation such as, on power on or at switching from a sleep mode to an active mode of the portable telephone, first, the signal supplied to antenna 1 is converted to the base band signal by quadrature mixer 5, the resulting signal is amplified by low-noise amplifier 6, an interference wave is removed by low-pass filter 7 and the resulting signal is supplied to variable gain amplifier 8 and logarithmic amplifier 11 at step S1 (in the drawings, S means step) in a similar manner as in the description of FIG. 1.

The sleep mode mentioned above is a state for current consumption reduction, in which though the power of the portable telephone is on, the power is not supplied to each block of the control circuit or the operation is suspended while the demodulation is not required. The active mode is an operation in which each block of the portable telephone is in an operative state but does not necessarily require the demodulation.

At step S2, the level of the base band signal at the input side of variable gain amplifier 8 is detected by logarithmic amplifier 11. The output of logarithmic amplifier 11 is converted into a digital signal by A/D converter 12 and the resulting signal is supplied to control unit 13. At step S3, control unit 13 controls and adjusts the gain of variable gain amplifier 8 such that the signal output from variable gain amplifier 8 is in the input voltage range of A/D converter 9 and detectable.

Thus, as the level of the base band signal is coarsely detected by logarithmic amplifier 11 and the gain of variable gain amplifier 8 is controlled at the start of the operation in this embodiment, the level of the signal supplied to A/D converter 9 would not exceed the input voltage range of A/D converter 9 itself nor fall below the level of resolution of A/D converter 9.

In the embodiment shown in FIG. 3, the level of the base band signal at the input side of variable gain amplifier 8 is detected by logarithmic amplifier 11. When the level at the input side of low-pass filter 7 is detected, the level of the base band signal before the removal of the interference wave is detected. Hence, error is produced in the level detection depending on the level of the interference wave. As a result, a desired signal to reach A/D converter 9 cannot be optimized through the adjustment of gain of variable gain amplifier 8.

Figure 5:
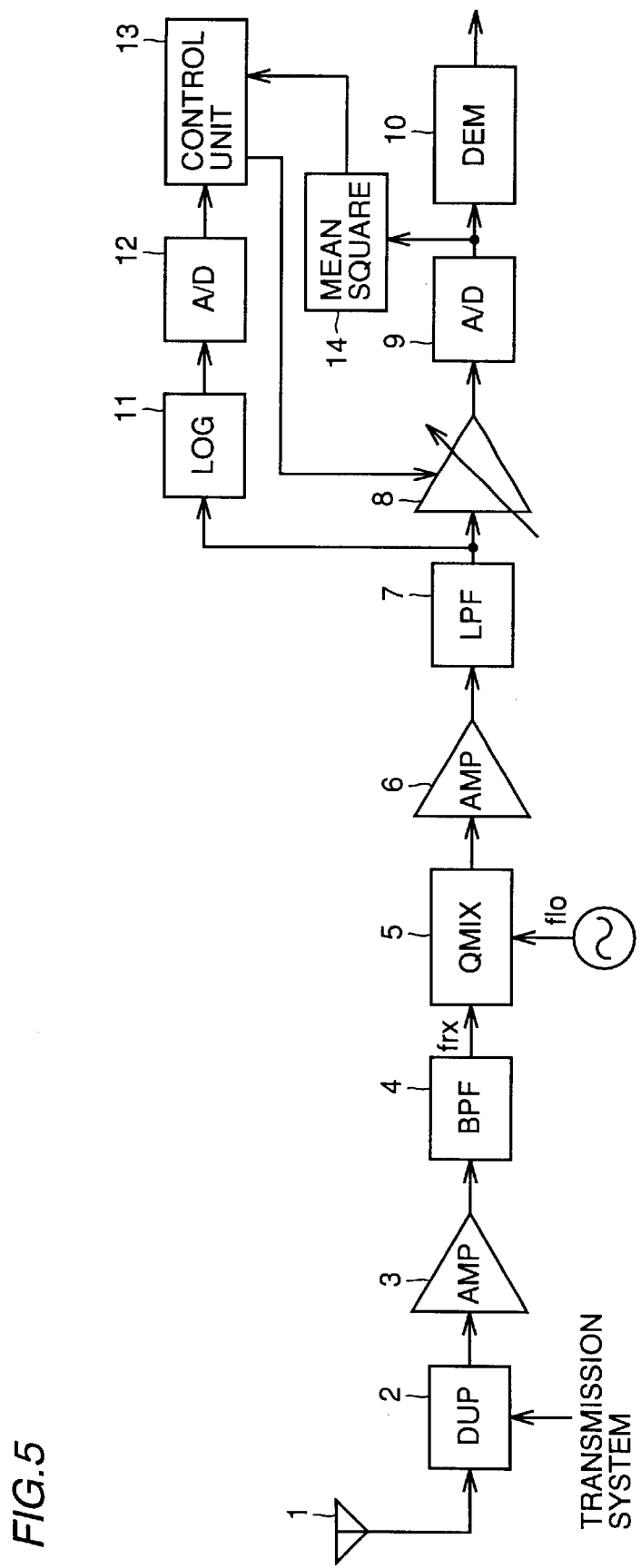
FIG. 5 is a block diagram of the second embodiment of the present invention.

FIG. 5 is a block diagram of the second embodiment of the present invention. In the second embodiment, the gain of variable gain amplifier 8 is feedforward controlled based on the detection output of logarithmic amplifier 11 as in the embodiment shown in FIG. 3 and at the same time, the gain of variable gain amplifier 8 is feedback controlled based on the detection output of AID converter 9. For this end, a mean square deriving circuit 14 for deriving and detecting a mean square of the output level of A/D converter 9 is provided and the output from mean square deriving circuit 14 is supplied to control unit 13.

Figure 6:
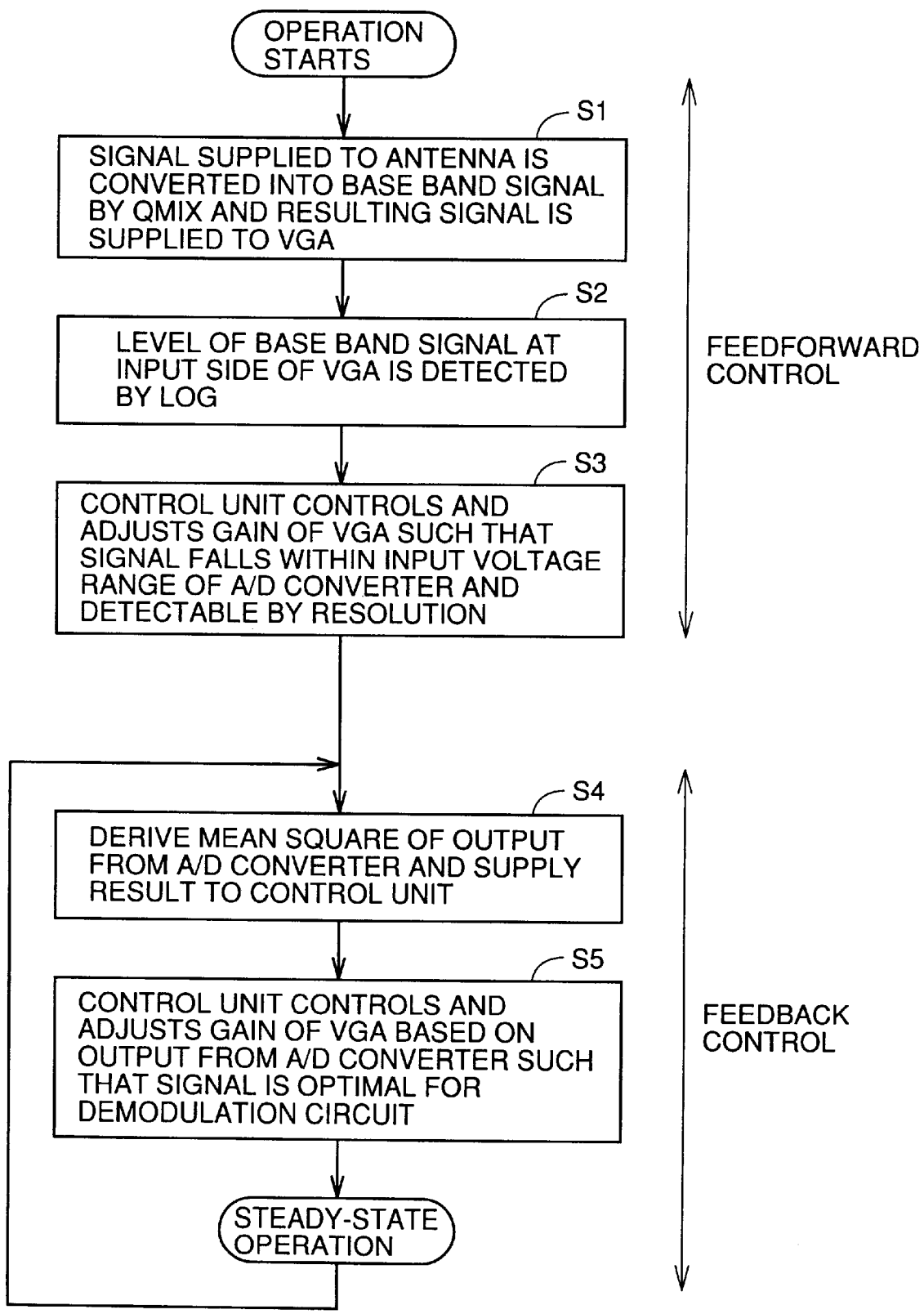
FIG. 6 is a flow chart referenced for describing an operation of the embodiment shown in FIG. 5.

FIG. 6 is a flow chart referenced for describing a specific operation of the embodiment shown in FIG. 5. In FIG. 6, the operations in step S1 to step S3 are same with those in FIG. 4. Through these processes, the gain of variable gain amplifier 8 is coarsely feedforward controlled at the start of the operation. Thereafter, the mean square of the output from A/D converter 9 is derived by mean square deriving circuit 14 and the resulting signal is supplied to control unit 13 at step S4. At step S5, control unit 13 controls and adjusts the gain of variable gain amplifier 8 based on the output of mean square deriving circuit 14 such that the output signal from variable gain amplifier 8 falls within the input voltage range of A/D converter 9 and detectable. In the feedback control, the gain of variable gain amplifier 8 is finely controlled. Thus, the operation changes to the normal operation.

Figure 7:
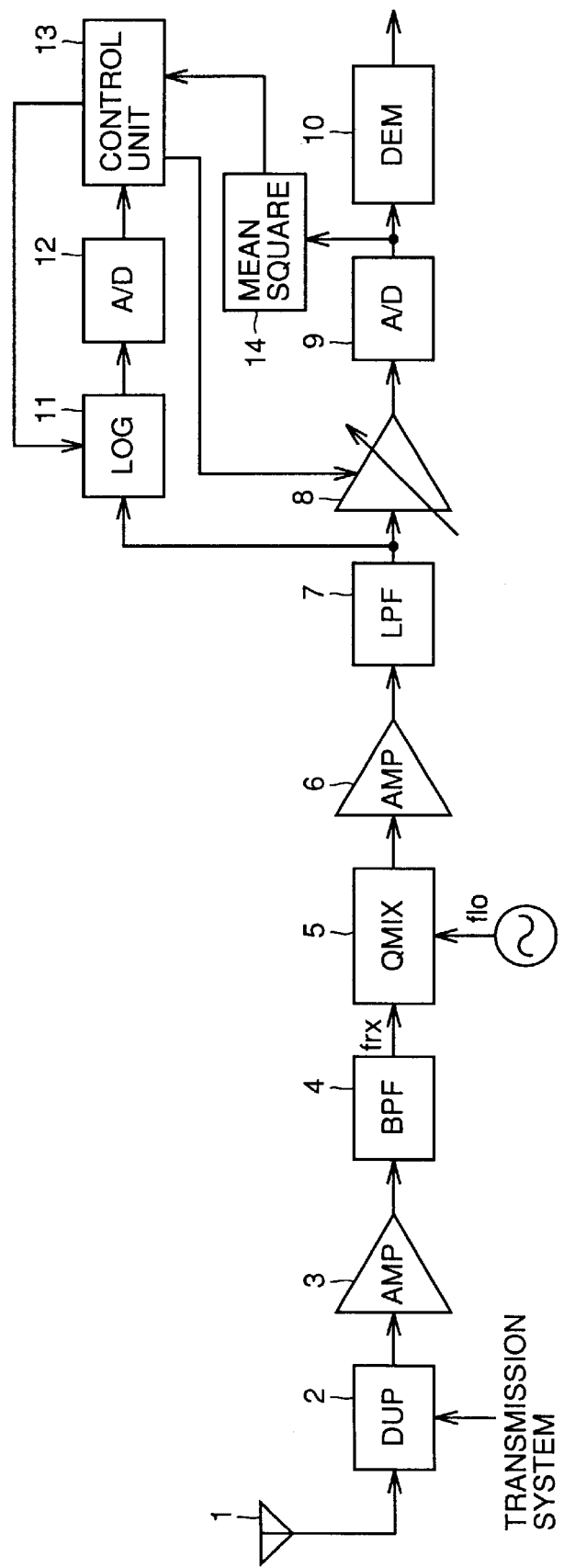
FIG. 7 is a block diagram of the third embodiment of the present invention.

FIG. 7 is a block diagram of the third embodiment of the present invention. In the embodiment shown in FIG. 7, the power is supplied to logarithmic amplifier 11 only at the start of the operation and when the feedforward control is finished the power supply to logarithmic amplifier 11 is cut off or reduced to decrease the current consumption. For this end, a control signal is supplied from control unit 13 to logarithmic amplifier 11.

Figure 8:
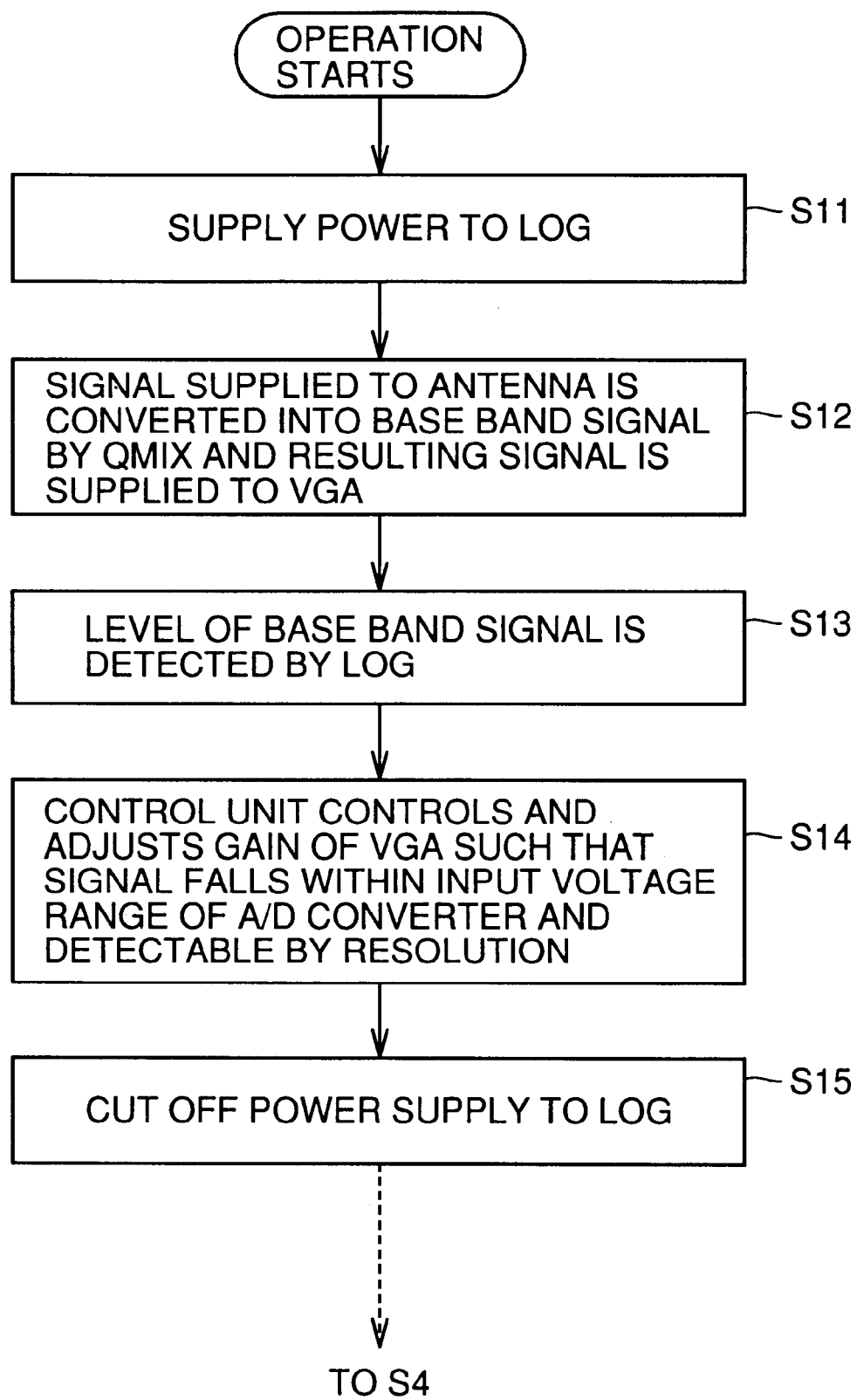
FIG. 8 is a flow chart referenced for describing an actual operation of the embodiment shown in FIG. 7.

FIG. 8 is a flow chart referenced for describing a specific operation of the embodiment shown in FIG. 7. Next, a specific operation of the embodiment shown in FIG. 7 will be described with reference to FIG. 8. When the operation starts, control unit 13 supplies power to logarithmic amplifier 11 at step S1 and then, the same operations as in steps Si to S3 of FIG. 4 are performed in steps S12, S13 and S14 to control the gain of variable gain amplifier 9. Then at step S15, the power supply to logarithmic amplifier 11 is cut off or reduced.

Hence, in this embodiment, the current consumption can be reduced as the power supply to logarithmic amplifier 11 is cut off during the feedback control.

In FIG. 8, step S14 and step S15 are interchangeable.

Figure 9A:
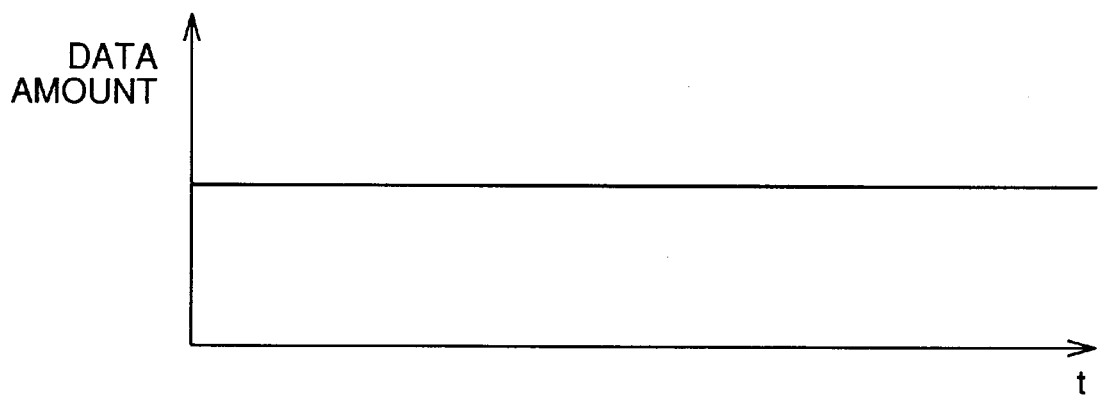
FIGS. 9A and 9B are graphs showing a method for measuring a level at switching from one base station to another base station as the fourth embodiment of the present invention.
Figure 9B:
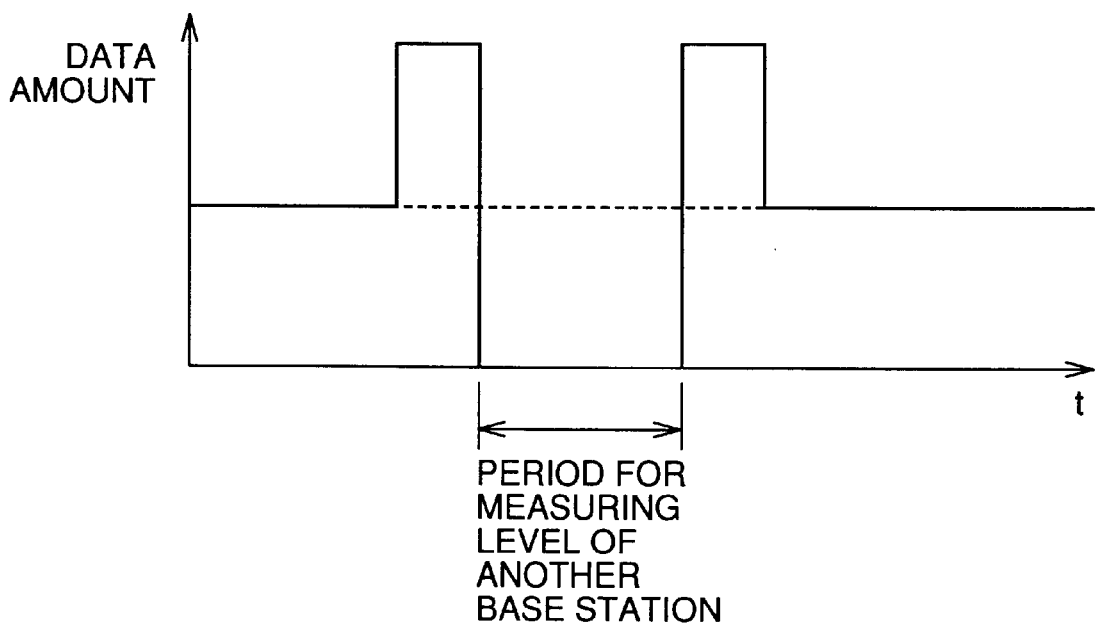
Figure 10:
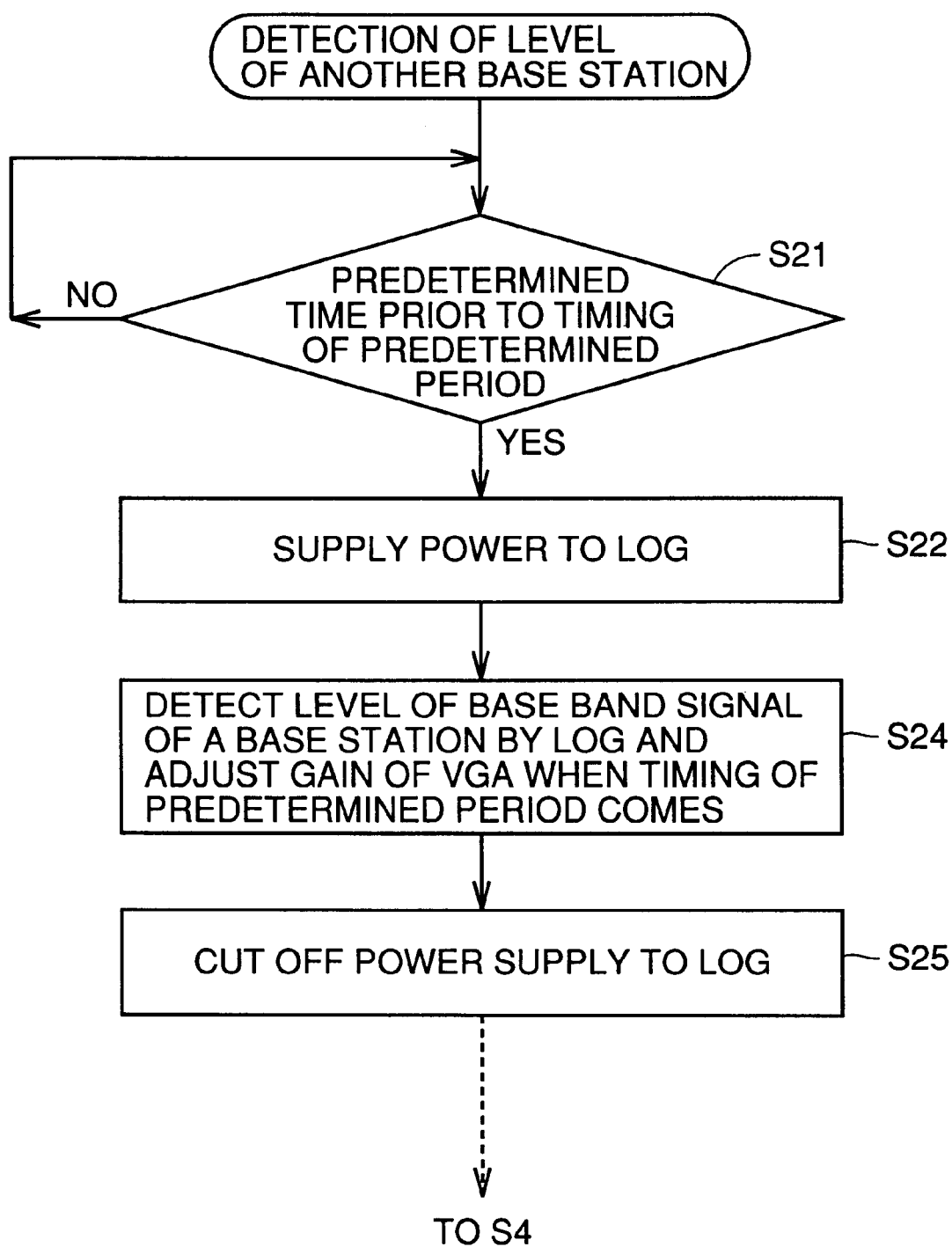
FIG. 10 is a flow chart referenced for describing an operation of the embodiment shown in FIGS. 9A and 9B.

FIGS. 9A and 9B are diagrams referenced for describing the fourth embodiment which is a method for detecting, when a caller moves from one wireless area of one base station to a wireless area of an adjacent base station which movement is generally referred to as a hand-over, using a communication system such as CDMA, an electric wave for a securable line to the adjacent base station while securing a line to the base station and FIG. 10 is a flow chart referenced for describing the operation thereof When the portable telephone is used, the data amount transmitted between a base station and a caller is constant in a normal operation as shown in FIG. 9A. The caller, however, sometimes moves from one wireless area of one base station to another wireless area of an adjacent base station. In this case, the level of the signal in the adjacent base station is not known. Hence, a level of a line is detected at certain intervals to allow securing of the adjacent base station other than the base station whose line the caller is currently securing. In this case, the transmission of data is suspended for a predetermined time period at predetermined intervals as shown in FIG. 9B and the data in this period is compressed and superposed on the previous or the subsequent data. The signal level detection for the line which would allow the securing of another base station is performed while the data transmission with the base station to which the line is currently secured is suspended.

In this case, the signal level of the other base station is not detected except at the time of signal level detection of the other base station. Hence, the level of the input signal is not known before the level detection of the other base station. Thus, it is preferable to perform the same operation as at the power-on as in the description of FIG. 4 above.

In this embodiment, the feedforward control and the feedback control shown in FIG. 6 are performed also at the time of measurement of the level of the other base station as described above. In the block diagram shown in FIG. 7, however, the level detection must be performed after the power is supplied to logarithmic amplifier 11 shortly before the predetermined period have elapsed and the operation of logarithmic amplifier 11 is stabilized. Thus, at step 21 shown in FIG. 10, control unit 13 determines whether it is a predetermined time prior to the timing of the predetermined period or not and when the time has come, supplies the power to logarithmic amplifier 11 at step S22. At the timing of the predetermined period, the level of the signal at the input side of variable gain amplifier 8 is detected by logarithmic amplifier 11 and control unit 13 controls the gain of variable gain amplifier 8 at step S24, then at step S25, control unit 13 cuts off or reduces the power supply to logarithmic amplifier 11. Thereafter the feedback control of steps S4 and S5 shown in FIG. 6 is performed.

Therefore, according to this embodiment, the gain of variable gain amplifier 8 is controlled fast and securely not only at the start of the operation such as at the power-on or at the switching from the sleep mode to the active mode, but at the detection of the signal level on the securable line of the adjacent base station at the time of hand-over.

Figure 11:
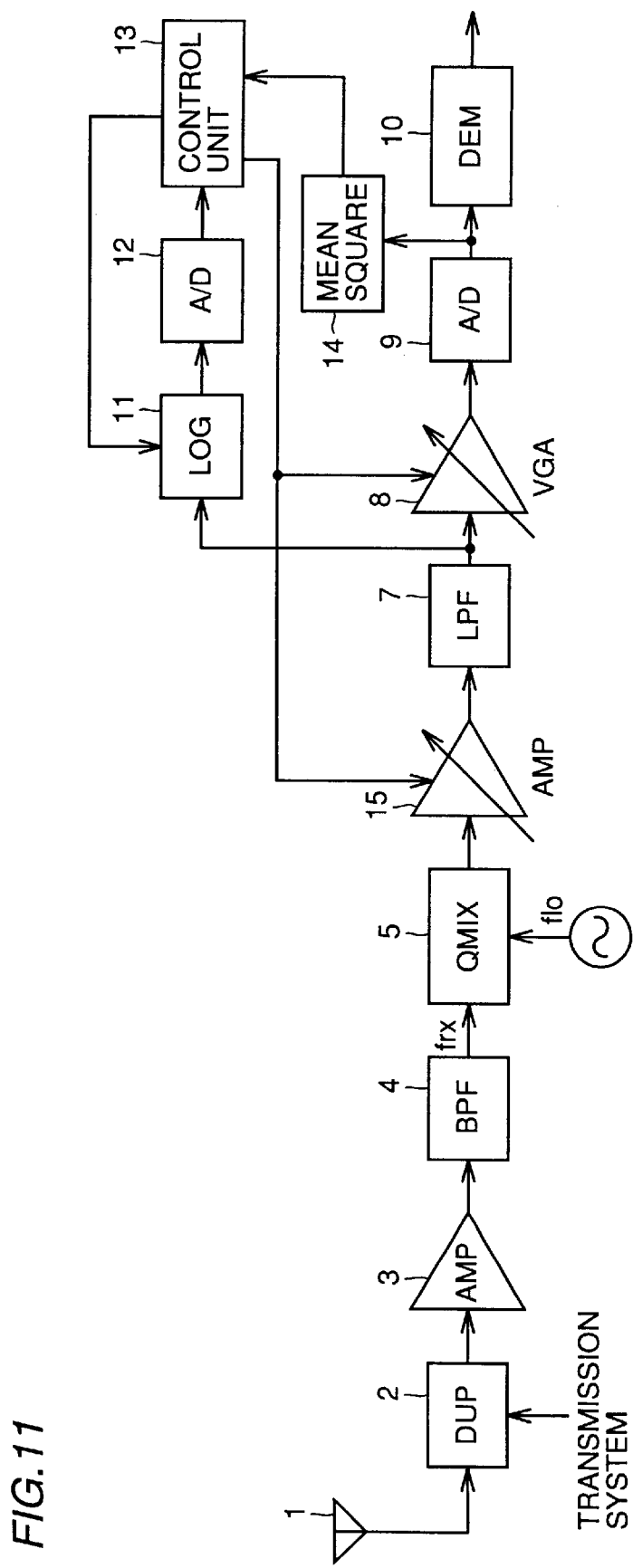
FIG. 11 is a block diagram of the fifth embodiment of the present invention.

FIG. 11 is a block diagram of the fifth embodiment of the present invention. In this embodiment, an amplifier 15 with a controllable gain is provided as an amplifier in a previous stage to low-pass filter 7 and the gain of amplifier 15 is controlled together with the gain of variable gain amplifier 8 by control unit 13.

Figure 12A:
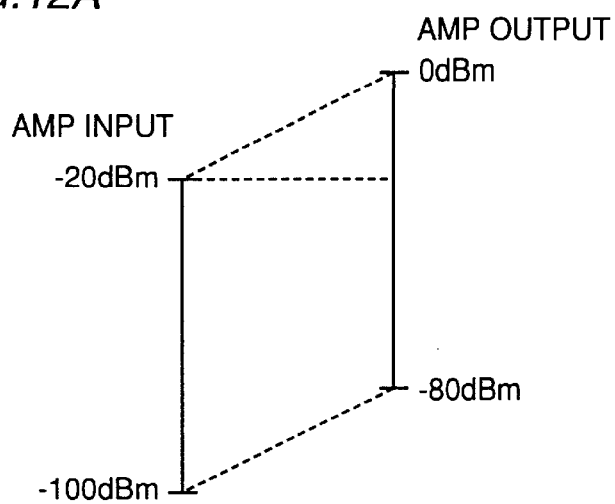
FIGS. 12A to 12D and FIGS. 13A to 13C are referenced for describing a method for controlling a gain of a low-noise amplifier in the embodiment shown in FIG. 11.
Figures 12B, 12C:
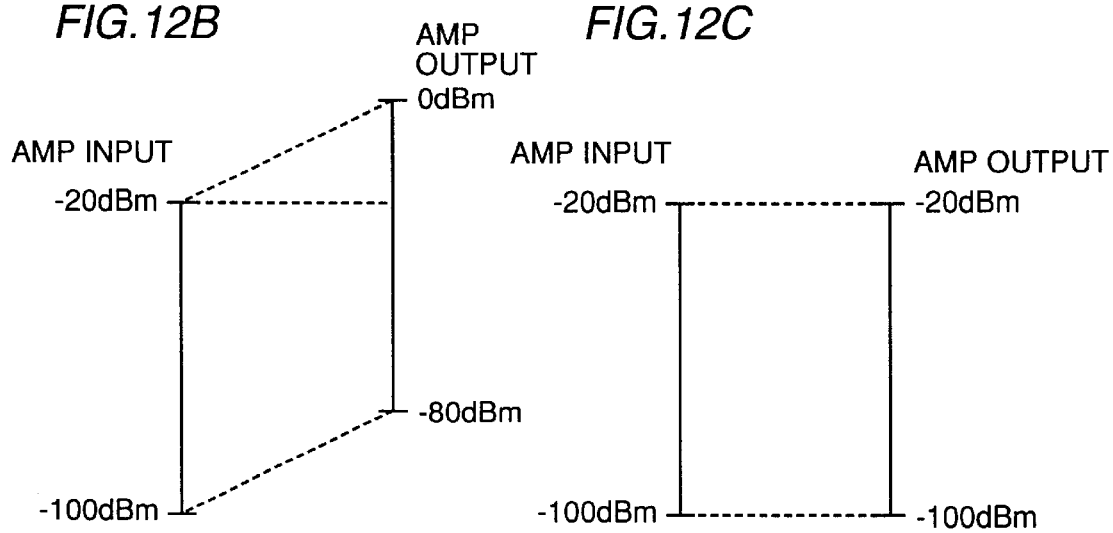
Figure 12D:
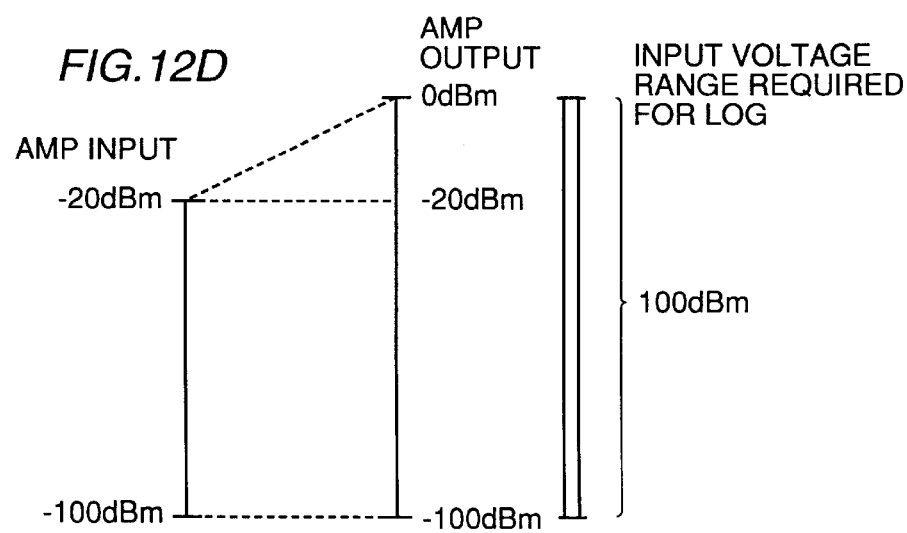
Figure 13A:
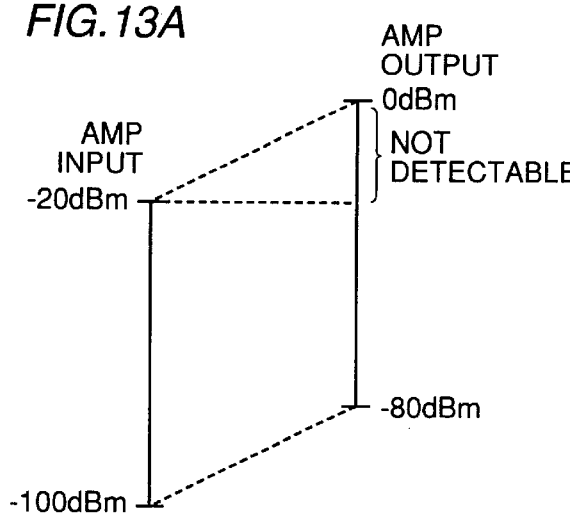
Figure 13B:
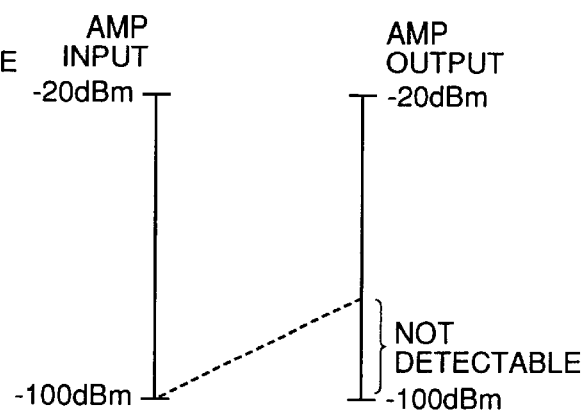
Figure 13C:
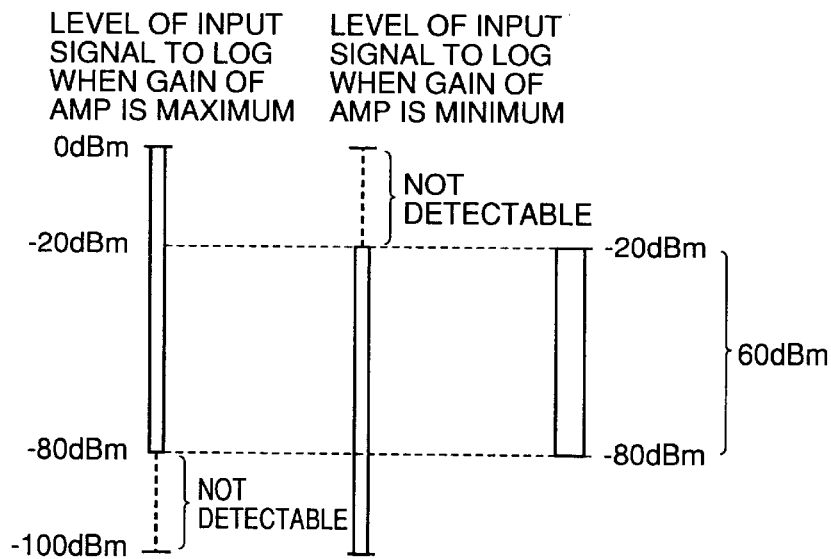
Figure 14:
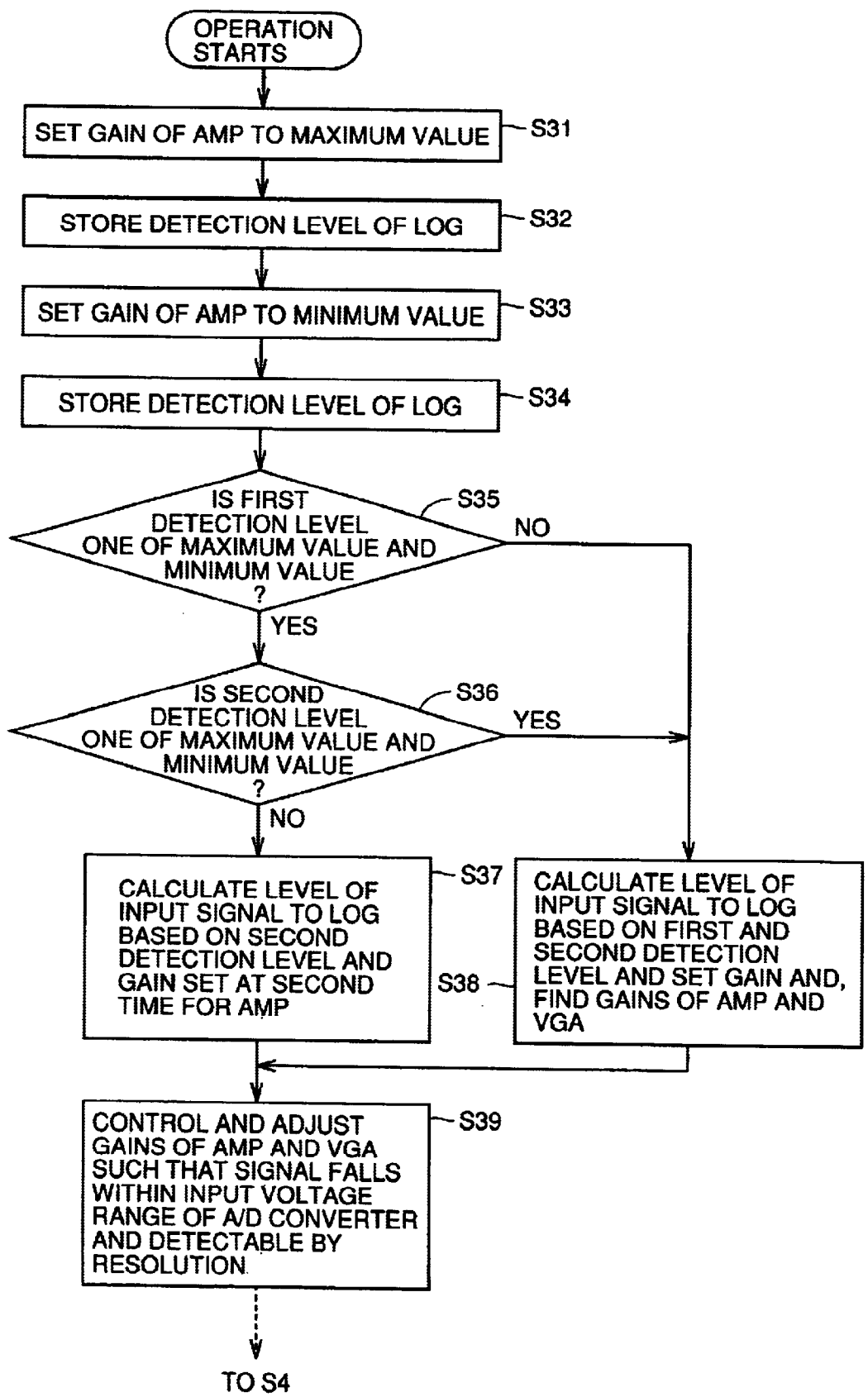
FIG. 14 is a flow chart referenced for describing an actual operation of the embodiment shown in FIG. 11.

FIGS. 12A to 12D and FIGS. 13A to 13C are diagrams referenced for describing the input level of amplifier 15 and the required input voltage range of logarithmic amplifier 11 for describing an operation of the embodiment shown in FIG. 11 and, FIG. 14 is a flow chart referenced for describing the operation thereof.

The required input voltage range of logarithmic amplifier 11 will be described assuming that the gain of amplifier 6 is not variable as shown in FIG. 7 mentioned above.

When the gain of amplifier 6 of FIG. 7 is 20 dB and the level of the input signal of amplifier 6 varies in the range from −20 dBm~−100 dBm as shown in FIG. 12A, the range of the output from amplifier 6 becomes 0 dBm~−80 dBm. This means the input voltage range equal to this range is sufficient as the range of logarithmic amplifier 11.

Next, as shown in FIG. 11, assume that the gain of amplifier 15 is variable in the range of 0 dB~20 dB. When the gain of amplifier 15 is set to the maximum value of 20 dB and the level of the input signal is in the range of −20 dBm~−100 dBm, the output of amplifier 15 is in the range of 0 dBm~−80 dBm. When the gain of amplifier 15 is set to the minimum value of 0 dB and the level of the input signal is in the range of −20 dBm~−100 dBm as shown in FIG. 12C, the output of amplifier 15 is in the range of −20 dBm~−100 dBm. Thus, the required input voltage range of logarithmic amplifier 11 is, 20 dB, that is the variable width of the gain of amplifier 15, higher than the range of the input signal level (−20−(−100))=80 dB, hence, the required input voltage range is 100 dB.

Thus, when amplifier 15 with a variable gain is provided in a previous stage of low-pass filter 7, the required input voltage range of logarithmic amplifier 11 becomes wide. When the level at the input side of variable gain amplifier 8 is to be detected through one feedforward control, logarithmic amplifier 11 with a wide input voltage range is required. To widen the input voltage range of logarithmic amplifier 11, however, in addition to the increase in the circuit size of the logarithmic amplifier, the current consumption rises.

In this embodiment, the level at the input side of variable gain amplifier 8 is fast detected with low current consumption without increase in the circuit size of logarithmic amplifier 11.

First, assume that amplifier 15 is set to the minimum gain of 0 dB as shown in FIG. 13A, and the input voltage range of logarithmic amplifier 11 is set as to cover the range of input level at the time, −20 dBm~−100 dBm. If amplifier 15 is set to the maximum gain of 20 dB and a signal in the range of −20 dBm~−100 dBm is input, logarithmic amplifier 11 cannot detect a signal with a level in the range of 0 dBm~−20 dBm in an output from amplifier 15.

Conversely, assume that amplifier 15 is set to the maximum gain of 20 dB as shown in FIG. 13B and the input voltage range of logarithmic amplifier 11 is set so as to cover the range of output level at the time, 0 dBm~−80 dBm. Here, if amplifier 15 is set to the maximum gain of 0 dB and a signal in the range of −20dBm~−100 dBm is input, a detection of a signal with a level in the range of −80 dBm~−100 dBm becomes impossible.

Hence, in this embodiment, the level to be detected by logarithmic amplifier 11 when the gain of amplifier 15 is set to the maximum value or to the minimum value as shown in FIG. 13C is detected and the gain of amplifier 15 and the input voltage range of logarithmic amplifier 11 are set such that a signal in a certain range would not become undetectable as described above.

In step S31 of FIG. 14, the gain of amplifier 15 is set to the maximum value of 20 dB as shown in FIG. 13A and control unit 13 stores the level detected by logarithmic amplifier 11 at this time at step S32. Then at step S33, the gain of amplifier 15 is set to the minimum value of 0 dB as shown in FIG. 13B and control unit 13 stores the level detected by logarithmic amplifier 11 at step S34.

At step S35, it is determined whether the first detected level stored at step S32 matches with the maximum value or the minimum value of the input voltage range of logarithmic amplifier 11 or not. If the level matches, a certain level becomes undetectable as shown in FIGS. 13A and 13B. Therefore, at step S36, it is determined whether the second detected level matches with the maximum value or the minimum value of the input voltage range of logarithmic amplifier 11 or not. If the level does not match, at step S37, the input voltage range of logarithmic amplifier 11 is determined based on the second detected level and the gain of amplifier 15 set at step S33. Then the gains of amplifier 15 and variable gain amplifier 8 are determined such that the determined input voltage range will be obtained.

If the first detected level does not match with the maximum value or the minimum value of the input voltage range of logarithmic amplifier 11 bat step S35, at step S38, the input voltage range of logarithmic amplifier 11 is determined based on the first detected level and the gain set for amplifier 15 at step S31. Then, the gains of amplifier 15 and variable gain amplifier 8 are determined such that the determined input voltage range is obtained.

At step S39, the gains of amplifier 15 and variable gain amplifier 8 are controlled by control unit 13 such that the determine gains will be obtained.

Thus, in this embodiment, the input voltage range of logarithmic amplifier 11 is determined based on the level to be detected by logarithmic amplifier 11 when the gain of amplifier 15 is set to the maximum value or the minimum value and the set gain of amplifier 15. As described above, when the level at the input side of variable gain amplifier 8 is to be detected through one feedforward control, logarithmic amplifier 11 must have a wide input voltage range. When feedforward control is performed twice and the input voltage range of logarithmic amplifier 11 is determined as in this embodiment, the logarithmic amplifier with a relatively narrow input voltage range can be used.

In addition, as the gain of amplifier 15 is made variable, even when a signal of a high level is input, the distortion of an output signal from low-pass filter 7 can be avoided by lowering the gain of amplifier 15. In addition, the gain of amplifier 15 can be set to the maximum value after it has been set to the minimum value.

Figure 15:
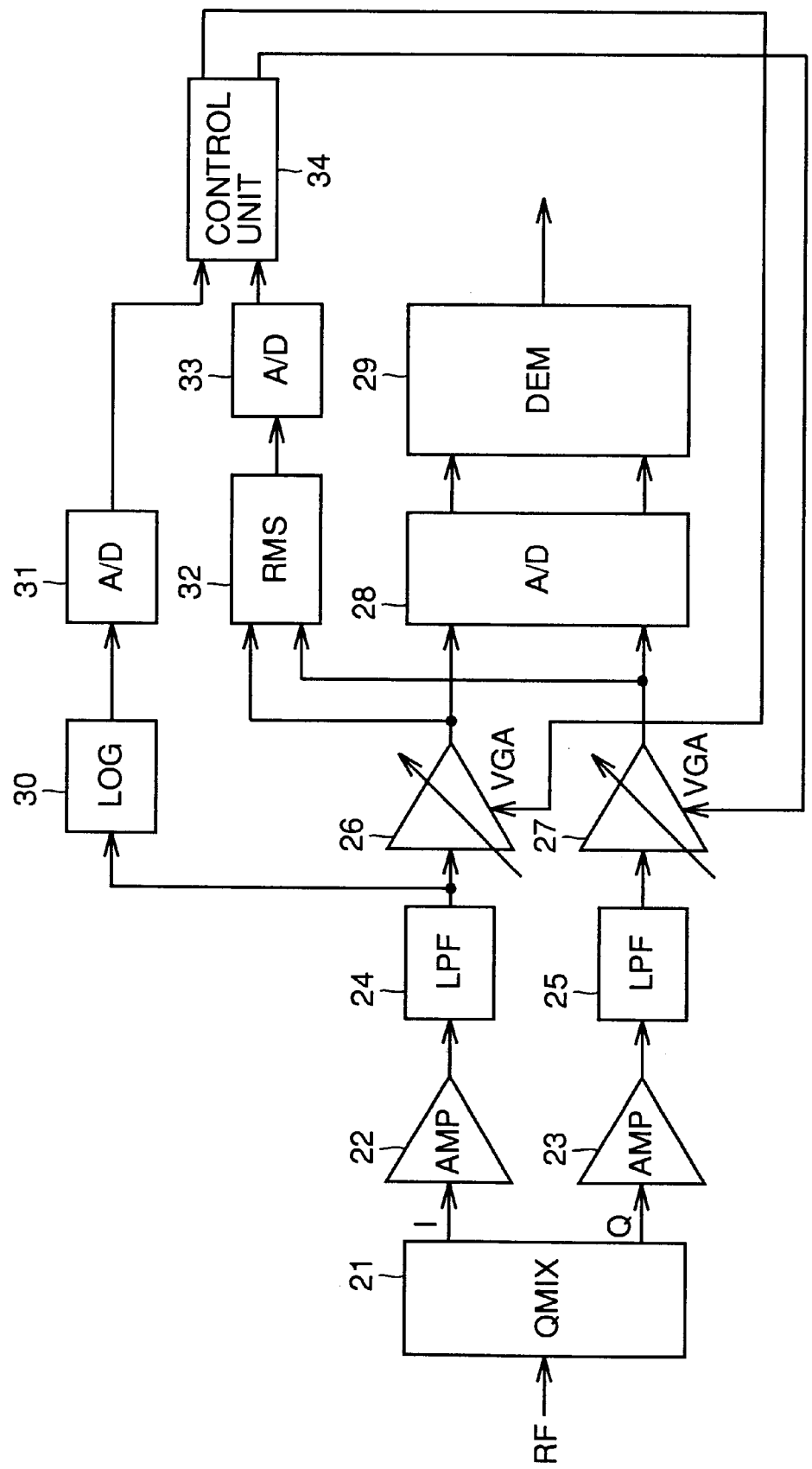
FIG. 15 is a block diagram of the sixth embodiment of the present invention.

FIG. 15 is a block diagram of the sixth embodiment of the present invention. In this embodiment, quadrature mixer 21 outputs an I channel signal and a Q channel signal having the same level and differing in phase by 90°. The I channel signal and the Q channel signal are amplified by amplifiers 22 and 23, and interference wave thereof are removed by low-pass filters 24 and 25 and the resulting signals are supplied to variable gain amplifiers 26 and 27, respectively. Here, the I channel signal is also supplied to a logarithmic amplifier 30. Outputs of variable gain amplifiers 26 and 27 are supplied to an AID converter 28 and converted into digital signals. Then, the resulting signals are supplied to a demodulation circuit 29 and demodulated, while being supplied to a root-mean-square circuit (RMS) 32 and mean square or square sum thereof are found. An analog signal of the output of root-mean-square circuit 32 is supplied to an A/D converter 33 and converted into a digital signal and supplied into a control unit 34. The output of logarithmic amplifier 30 is converted into a digital signal by A/D converter 31 and the resulting signal is supplied to control unit 34.

In this embodiment, only the I channel signal is supplied to logarithmic amplifier 11, because the I channel signal is different from the Q channel signal only in the phase by 90° and the signal levels of two signals are the same, therefore the detection of the level of one signal is sufficient. Hence, the signal supplied to logarithmic amplifier 30 can be the Q channel signal instead of the I channel signal.

The operation of the embodiment shown in FIG. 15 is same with the operation described with reference to the flow chart shown in FIG. 6. At the start of the operation, control unit 34 performs feedforward control of variable gain amplifiers 26 and 27 based on the detection output of logarithmic amplifier 30, then control unit 34 performs feedback control of variable gain amplifiers 26 and 27 based on the levels of signals from the variable gain amplifiers 26 and 27 detected by root-mean-square circuit 32.

Hence, in this embodiment again, the gain control of variable gain amplifiers 26 and 27 can be performed fast and securely at the start of the operation based on the level detected by logarithmic amplifier 30.

Figure 16:
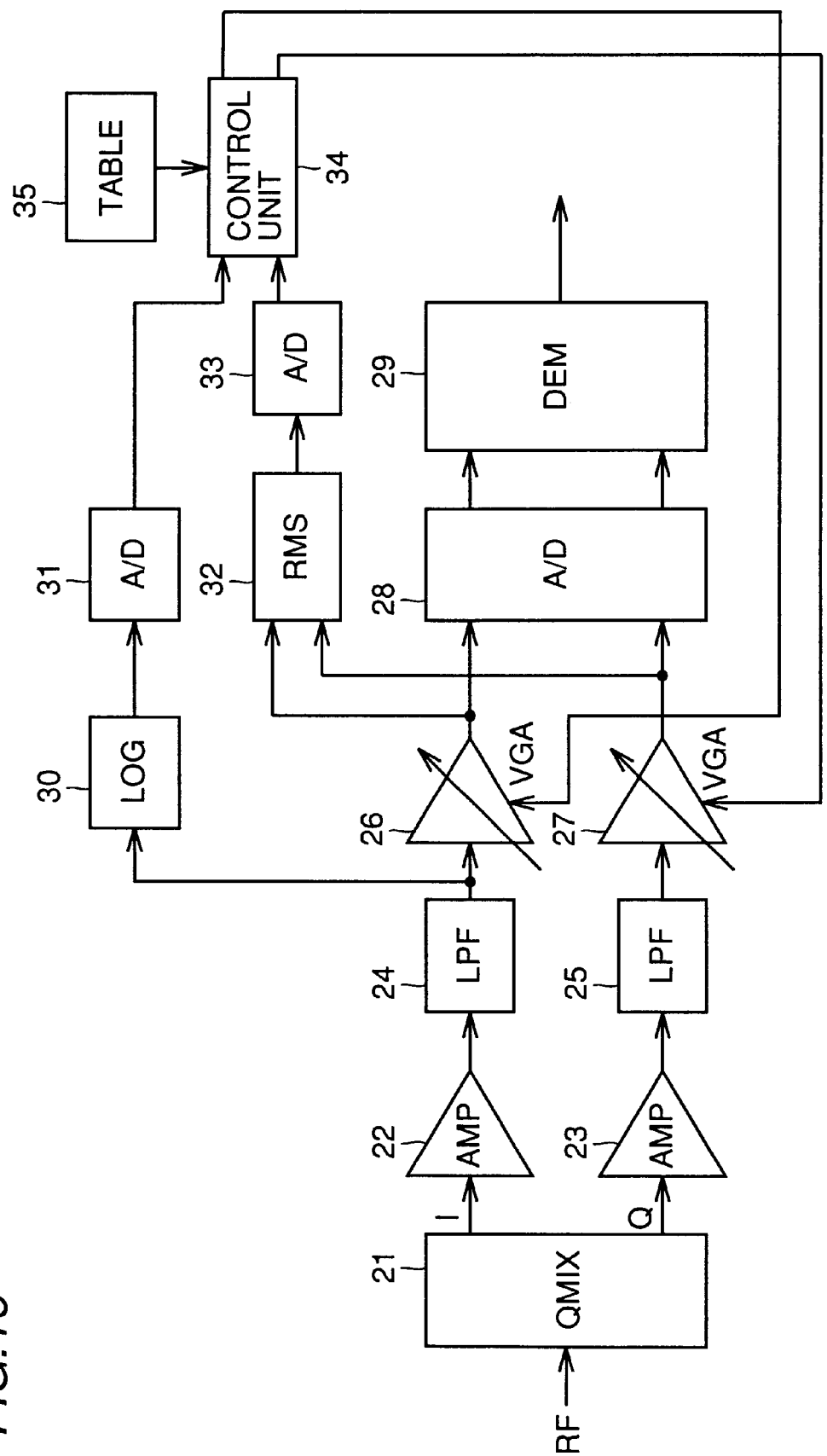
FIG. 16 is a block diagram of the seventh embodiment of the present invention.

FIG. 16 is a block diagram of the seventh embodiment of the present invention. In this embodiment, a table 35 is added to the embodiment shown in FIG. 15. Some of the levels to be detected by logarithmic amplifier 30 are previously measured and table 35 stores gains of variable gain amplifiers 26 and 27 corresponding to these level, respectively. At a production line of a factory, for example, the adjustment can be made even easier when the detection level of each logarithmic amplifier 30 and the gains of variable gain amplifiers 26 and 27 stored in table 35 are read from table 35 and variable gain amplifiers 26 and 27 are controlled by control unit 34.

As can be seen from the foregoing, in the present invention, a level of a received signal supplied to a variable gain circuit is detected at a start of an operation by a level detection circuit having a wide input voltage range and a gain of the variable gain circuit is coarsely feedback controlled and then, the gain of the variable gain circuit is finely feedback controlled based on a level of an output of a conversion circuit converting an output of the variable gain circuit into a digital signal. Thus, the adjustment can be made to obtain fast and securely a signal falling within an input voltage range of the conversion circuit and detectable by a resolution thereof whereby the present invention is applicable to portable telephones, for example, in which a low current consumption is desirable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wireless terminal device comprising:

a variable gain circuit having a variable gain and receiving a received signal;

a first level detecting circuit having a widely selected input voltage range and detecting a level of the received signal supplied to said variable gain circuit;

a converting circuit converting an output signal from said variable gain circuit into a digital signal;

a second level detecting circuit detecting a level of an output signal from said converting circuit; and a controlling circuit coarsely controlling the gain of said variable gain circuit based on a detection output of said first level detecting circuit at a start of an operation then, finely controlling the gain of said variable gain circuit based on a detection output of said second level detecting circuit and, adjusting the output signal from said variable gain circuit such that the output signal from said variable gain circuit falls within an input voltage range of the converting circuit and is detectable with a resolution;

wherein said first level detecting circuit includes a logarithmic amplifier; and wherein said controlling circuit supplies power to said logarithmic amplifier at the start of the operation and stops or reduces the power supply to said logarithmic amplifier at a normal-state.

2. The wireless terminal device according to claim 1, said wireless terminal device being a mobile terminal device performing a level detection at predetermined intervals to allow detection of a reception level of a signal from an adjacent wireless area when moving into the adjacent wireless area, wherein said controlling circuit supplies power to said logarithmic amplifier just before one of said predetermined intervals has elapsed.

3. The wireless terminal device according to claim 1 further comprising an amplifying circuit provided in a previous stage of said variable gain circuit and having a variable gain, wherein said controlling circuit sets the input voltage range of the first level detecting circuit based on the level detected by said first level detecting circuit when the gain of said amplifying circuit is set to a maximum value or a minimum value at the start of the operation.

* * * * *

UNITED STATES PATENT AND TRADEMARK OFFICE
CERTIFICATE OF CORRECTION

PATENT NO.    : 6,683,925 B1
DATED         : January 27, 2004
INVENTOR(S)   : Katsura et al.

It is certified that error appears in the above-identified patent and that said Letters Patent is hereby corrected as shown below:

<u>Title page,</u>
Item [62], Related U.S. Application Data, should read -- Continuation of appliation No. PCT/JP99/00851, filed on Feb. 24, 1999 --.

Signed and Sealed this

Eighteenth Day of May, 2004

JON W. DUDAS
*Acting Director of the United States Patent and Trademark Office*